(12) United States Patent
Tucker

(10) Patent No.: US 6,501,337 B1
(45) Date of Patent: Dec. 31, 2002

(54) METHOD AND APPARATUS FOR CORRECTING THE EFFECT OF DIELECTRIC ABSORPTION IN AN OPEN-LOOP MODULATOR CIRCUIT

(75) Inventor: Mark E. Tucker, Norcross, GA (US)

(73) Assignee: Cirronet, Inc., Norcross, GA (US)

( * ) Notice: Subject to any disclaimer, the term of this patent is extended or adjusted under 35 U.S.C. 154(b) by 14 days.

(21) Appl. No.: 09/815,664

(22) Filed: Mar. 23, 2001

Related U.S. Application Data

(60) Provisional application No. 60/192,424, filed on Mar. 24, 2000.

(51) Int. Cl.[7] .................................................. H03L 7/00
(52) U.S. Cl. .......................................... 331/17; 455/260
(58) Field of Search ................................ 455/260, 262, 455/264, 265; 331/17

(56) References Cited

U.S. PATENT DOCUMENTS

| | | | |
|---|---|---|---|
| 4,267,503 A | * | 5/1981 | Westra ........................ 324/659 |
| 5,379,002 A | | 1/1995 | Jokura ......................... 331/10 |
| 5,557,242 A | | 9/1996 | Wetherell .................... 331/17 |
| 5,960,046 A | | 9/1999 | Morris et al. ................ 375/347 |
| 6,032,033 A | | 2/2000 | Morris et al. ............. 455/277.2 |
| 6,088,337 A | | 7/2000 | Eastmond et al. ........... 370/280 |
| 6,094,575 A | | 7/2000 | Anderson et al. ........... 455/422 |
| 6,097,707 A | | 8/2000 | Hodzic et al. .............. 370/321 |
| 6,104,708 A | | 8/2000 | Bergamo .................... 370/320 |
| 6,172,971 B1 | | 1/2001 | Kim ........................... 370/348 |
| 6,223,061 B1 | * | 4/2001 | Dacus et al. ................ 455/522 |

* cited by examiner

Primary Examiner—Robert Pascal
Assistant Examiner—Joseph Chang
(74) Attorney, Agent, or Firm—Wallenstein & Wagner, Ltd.

(57) ABSTRACT

A method and apparatus for reducing the effects of dielectric absorption to a loop filter capacitor utilized in a dual-mode open-loop modulator having a transmit and receive communication frequency. The modulator incorporating a phase lock loop having means for maintaining a substantially constant voltage across the loop filter capacitor irrespective of the communication frequency implemented.

17 Claims, 2 Drawing Sheets

METHOD AND APPARATUS FOR CORRECTING THE EFFECT OF DIELECTRIC ABSORPTION IN AN OPEN-LOOP MODULATOR CIRCUIT

RELATED APPLICATIONS

This patent application claims the benefit of U.S. Provisional Patent application, entitled "Modulation Systems and Techniques," Ser. No. 60/192,424, filed Mar. 24, 2000.

TECHNICAL FIELD

The present invention is generally related to modulation systems. More specifically, the present invention is directed to a dual-mode open-loop modulator for a local oscillator capable of transmitting and receiving a communication signal.

BACKGROUND OF INVENTION

The present invention includes modulation systems and techniques that balance four factors in radio design: cost, performance, current consumption, and size. Generally, improvement to any one of the parameters usually results in a detriment to at least one the remaining three. Obtaining the best design requires determining the best mix of these four factors.

One of the first decisions encountered in a new design is to decide which modulation technique to utilize. There are many approaches to choose from, ranging from ordinary amplitude modulation (AM) to more sophisticated and complex quadrature amplitude modulation (QAM). Based on research and experimentation with most of these techniques over the years, it is acknowledged that frequency shift keying (FSK) offers one of the best overall combinations related to cost, performance and low complexity.

FSK is easy to demodulate and utilizes a common limiter-discriminator circuit for demodulation. This demodulation technique has been around for 20 years and is easy to obtain, is inexpensive and works very well.

One major technical difficulty with utilizing FSK is encountered during the design of the modulator. Many wireless devices incorporate a frequency synthesizer to stabilize the frequency of the signal being transmitted by the unit. The synthesizer is "locked" to a stable crystal reference frequency. As a result, the output frequency is very stable over time and temperature. However, in an FSK modulated system, the object is to instantaneously vary the output frequency to convey information. Therefore, the FSK modulator must address two opposing design objectives. The FSK modulator must be able to vary its output frequency to convey information and, simultaneously maintain a very stable average center frequency over the course of the modulation period.

The following sequence of events commonly occur within the modulator circuit. See FIG. 1. Initially, a switch, e.g., a single pole single throw (SPST), is closed. This action causes the voltage control oscillator (VCO) output to lock to a frequency of Nx (reference frequency). If a modulation voltage were to be fed into the loop filter at this point in time, the phase lock loop (PLL) would attempt to counteract the modulation voltage variations in an effort to maintain a constant output frequency. This inherently corrective characteristic of the PLL renders the circuit impractical as a modulator. However, if the switch is opened and the modulation voltage is then summed in at that moment, the VCO output frequency will vary as a function of the modulation signal without the corrective actions of the PLL being implemented.

The key factor to making this approach successful is timing. The moment the switch is opened, the voltage impressed across the loop filter (and VCO) begins to decay and drop to 0 volts. This sag translates into an undesirable frequency error (drift). However, if the open-loop period is kept short, i.e., less than a few milliseconds, then the VCO frequency drift can be kept to a minimum. Careful selection of the components for the loop filter in addition to a short open-loop period can produce frequency drift of less than 10 KHz in a few millisecond period.

To further reduce the cost of radios, direct modulation architecture can also be employed. This architecture utilizes a single local oscillator (LO) for both transmit and receive communication functions in the radio. See FIG. 2.

Note that the LO output is split to serve as both the transmitter signal source and as the first down-convert oscillator for the receiver. Radio design according to the present invention operates over a frequency range of 2.400 to 2.480 GHz and an intermediate frequency (IF) of 112.3 MHz. During a typical transmit period, the LO would be tuned to 2.44 GHz. Modulation would then be impressed onto the LO using the above mentioned open-loop technique. During the receive period, the LO can be tuned down by 112.3 MHz to provide an offset LO for the receiver. The incoming received signal (at the same frequency as the previously transmitted signal) is down-converted to an IF of 112.3 MHz and is then demodulated. The circuit used to tune and modulate the LO is shown in FIG. 3.

The transmission frequency chosen for implementation is based on many factors; such factors include: technology, capacity, reliability, government regulations, etc. In some instances, it may be preferable for a radio designer to utilize a frequency within the radio circuitry that is different than the frequency chosen for final transmission. In such cases, the radio designer may opt to work with an internal circuit frequency that is more manageable and easier to work with than perhaps an extremely high frequency selected for external transmission. In such cases, the internal circuit frequency can be adjusted prior to its external transmission by frequency doubling, halving or frequency heterodyning.

At the beginning of the transmit period, the synthesizer is in normal operating mode and the VCO is locked to a predetermined channel frequency. At a prescribed moment, the output of the synthesizer goes into a tri-state or high-impedance mode. This will effectively "open" the continuous loop and modulation is then applied to the VCO. After modulation has occurred, the transmit period is completed and the synthesizer re-tunes the VCO down by 112.3 MHz where it serves as the first LO in the receiver. The continuous loop is then "closed" and will remain closed during the receive period.

A low-side LO injection may also be used wherein the local oscillator frequency is always tuned below the incoming frequency by 112.3 MHz. The VCO is designed so that an increase in tuning voltage results in an increase in output frequency. Therefore, the tuning voltage during the receive period will always be lower than the tuning voltage during the transmit period.

However, the use of multiple frequencies is susceptible to various problems. One such problem affects circuit capacitors in the loop filter and is known as "dielectric absorption." Dielectric absorption produces an undesired "memory" effect in the capacitors of the loop filter. For example, a typical VCO may be tuned to approximately 1 V during the receive period. The receive period can extend to many milliseconds. During the receive period, the loop filter capacitor(s) are "soaking" at 1 V. During the transmit period, the VCO is re-tuned to a different voltage, i.e., 2 V. The re-tuning requires approximately 250 microseconds to complete. However, the moment the continuous phase lock loop is opened so that modulation can be applied, the voltage across the capacitor(s), i.e., C1 and C2, tends to fall to the previous "soaked" voltage level of 1 V. The loop is open at this point and no correction can be made to bring the tune voltage back to the appropriate value of 2 V. Moreover, correction is not desirable at this time because modulation is occurring. The voltage droop across the capacitor(s) is passed onto the VCO where it translates into frequency drift of the transmit signal. The drift can be severe, e.g., some capacitors have a high dielectric absorption and the resulting frequency drift falls outside the receiver's passband within 100 microseconds.

There are capacitors available that exhibit very low levels of dielectric absorption. Utilizing these capacitors will reduce the voltage droop, and the resulting frequency drift, to manageable levels. However, these capacitors are in leaded form and are larger than desirable.

SUMMARY OF THE INVENTION

The present invention provides an effective way to reduce the effect of dielectric absorption in a dual-mode modulator utilizing different frequencies for transmitting and receiving communication signals.

Accordingly, an embodiment of the present invention is a method of providing an open-loop modulated carrier frequency to a local oscillator utilizing a receive mode and a transmit mode for signal communication. The method provides a phase lock loop comprising a synthesizer, a loop filter having a voltage across a capacitor, an op-amp circuit, a voltage control oscillator having an input voltage, and a modulator. The components of the phase lock loop are operably coupled together to form a continuous loop. The phase lock loop is capable of stabilizing a center frequency for cooperating with a transmit frequency, a receive frequency and an intermediate frequency. A tuning voltage applied to a voltage control oscillator determines the communication mode of the voltage control oscillator, i.e., transmit or receive. The transmission mode requires the phase lock loop to be opened. Modulation is impressed upon the center frequency for transmitting information. Independent of the communication mode, the voltage across the capacitor of the loop filter is maintained substantially constant. The substantially constant voltage across the capacitor reduces the adverse effect of dielectric absorption upon the capacitor, thus reducing frequency drift to the transmit frequency during open-loop modulation.

Another embodiment of the present invention is directed to a dual-mode open-loop modulator for a local oscillator utilizing a transmit mode and a receive mode communication frequency. The dual-mode open-loop modulator comprises a synthesizer for stabilizing a reference frequency. The synthesizer being operably responsive to the communication frequency mode. A loop filter having a voltage across a capacitor is operably connected to the output of the synthesizer. An op-amp circuit includes a first and second input and an output wherein the first input of the op-amp is operably responsive to the loop filter voltage. The second input of the op-amp is operably responsive to an offset voltage and the output of the op-amp circuit. A modulator circuit includes a voltage control oscillator having an input and an output. The input of the voltage control oscillator is operably responsive to a tuning voltage, the output of the op-amp circuit and a modulator. The output of the voltage control oscillator is operably connected to the synthesizer and the local oscillator. The loop filter voltage is maintained substantially constant during either communication frequency mode wherein the substantially constant loop filter voltage minimizes dielectric absorption of the loop filter capacitor, thus reducing frequency drift of the reference frequency during open-loop modulation.

A further aspect of the present invention includes an offset voltage applied to the second input of the op-amp circuit wherein the offset voltage is responsive to the communication mode of the modulator.

Another further aspect to the present invention is directed to the offset voltage applied during the transmit mode being substantially equal to the difference in tuning voltages respectively applied to the voltage control oscillator during the transmit mode and the receive mode.

Yet another further aspect of the present invention is directed to the offset voltage being correlated to a frequency offset substantially equal to a first intermediate frequency of the phase lock loop.

An object of the present invention is directed to alleviating the adverse effects of dielectric absorption in a dual-mode open-loop modulator utilizing a capacitor within its loop filter.

Other advantages and aspects of the present invention will become apparent upon reading the following description of the drawings and detailed description of the invention.

DETAILED DESCRIPTION OF PREFERRED EMBODIMENT

Figure 1:
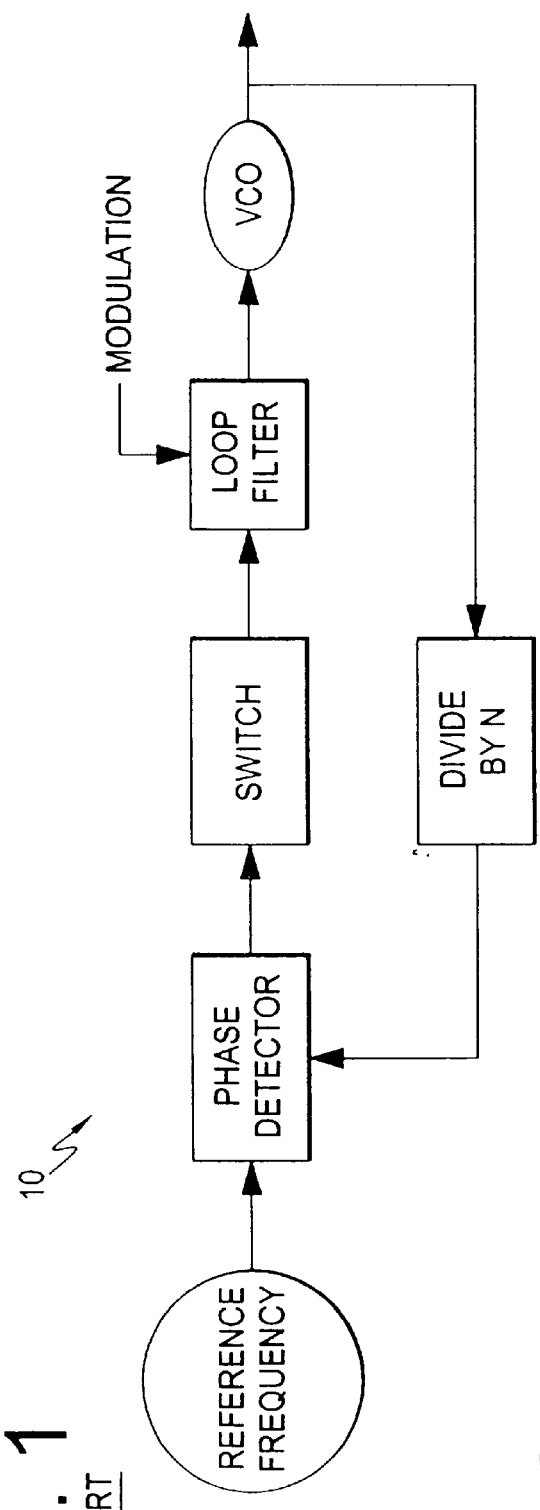
FIG. 1 is a block diagram depicting an open-loop modulator.
Figure 2:
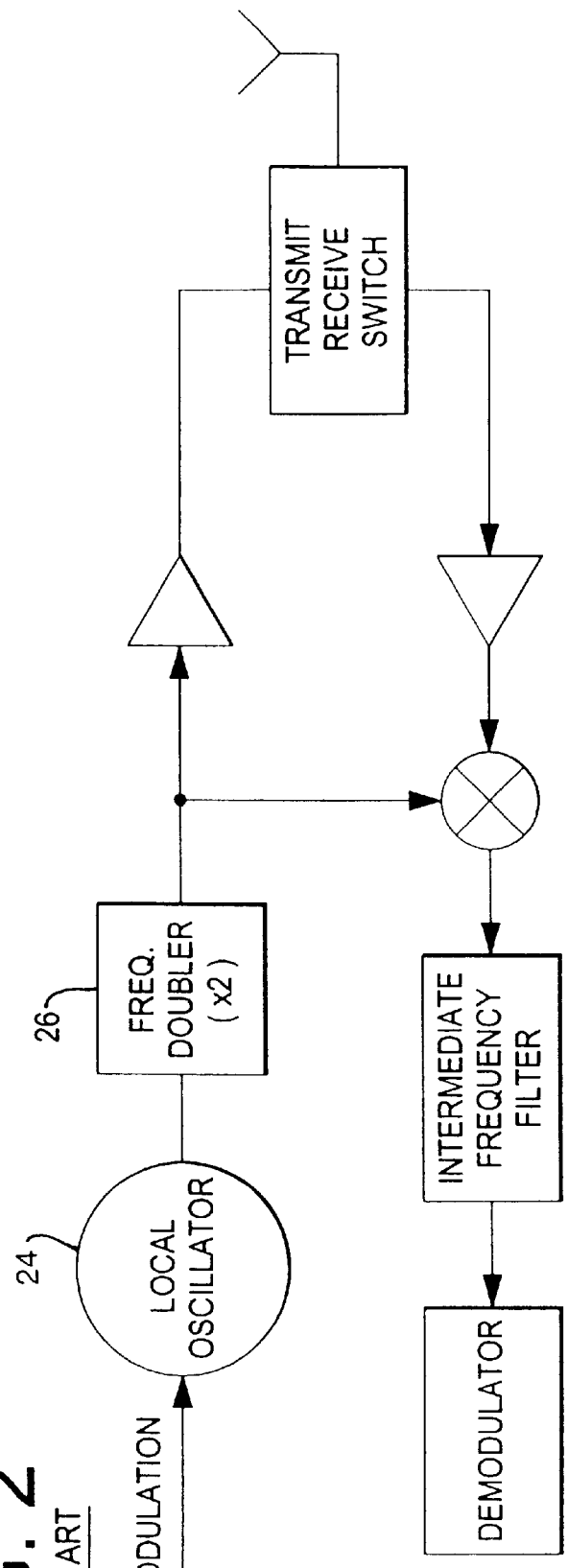
FIG. 2 is a block diagram depicting a direct modulation architecture utilizing a single local oscillator for both the transmit and receive communication frequencies.
Figure 3:
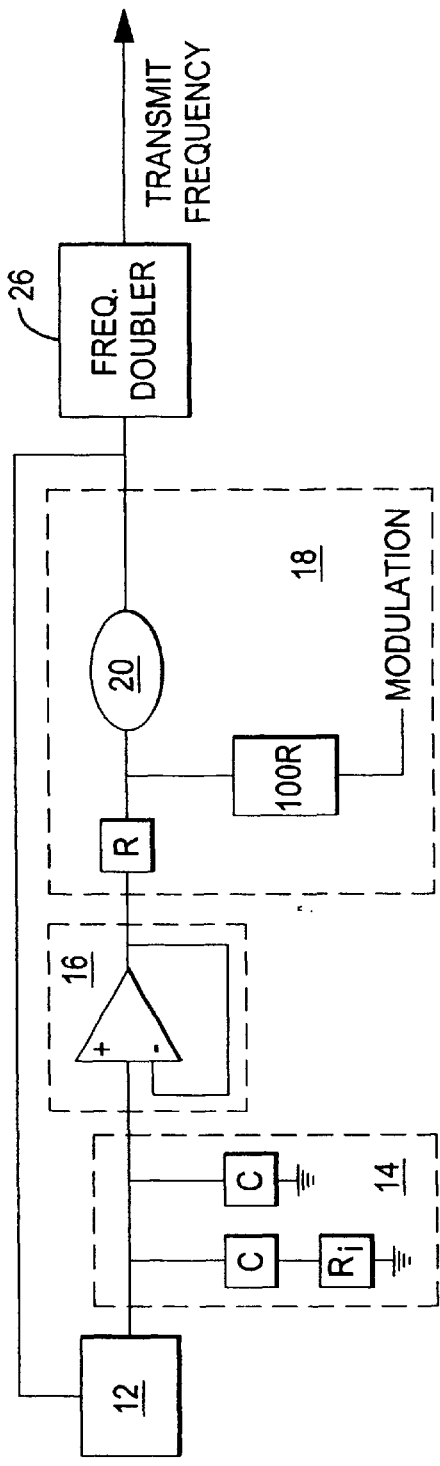
FIG. 3 is a block diagram of a circuit utilized to tune and modulate the local oscillator.

While this invention is susceptible of embodiments in many different forms, there is shown in the drawings and will herein be described in detail a preferred embodiment of the invention with the understanding that the present disclosure is to be considered as an exemplification of the principles of the invention and is not intended to limit the broad aspect of the invention to the embodiment illustrated.

Figure 4:
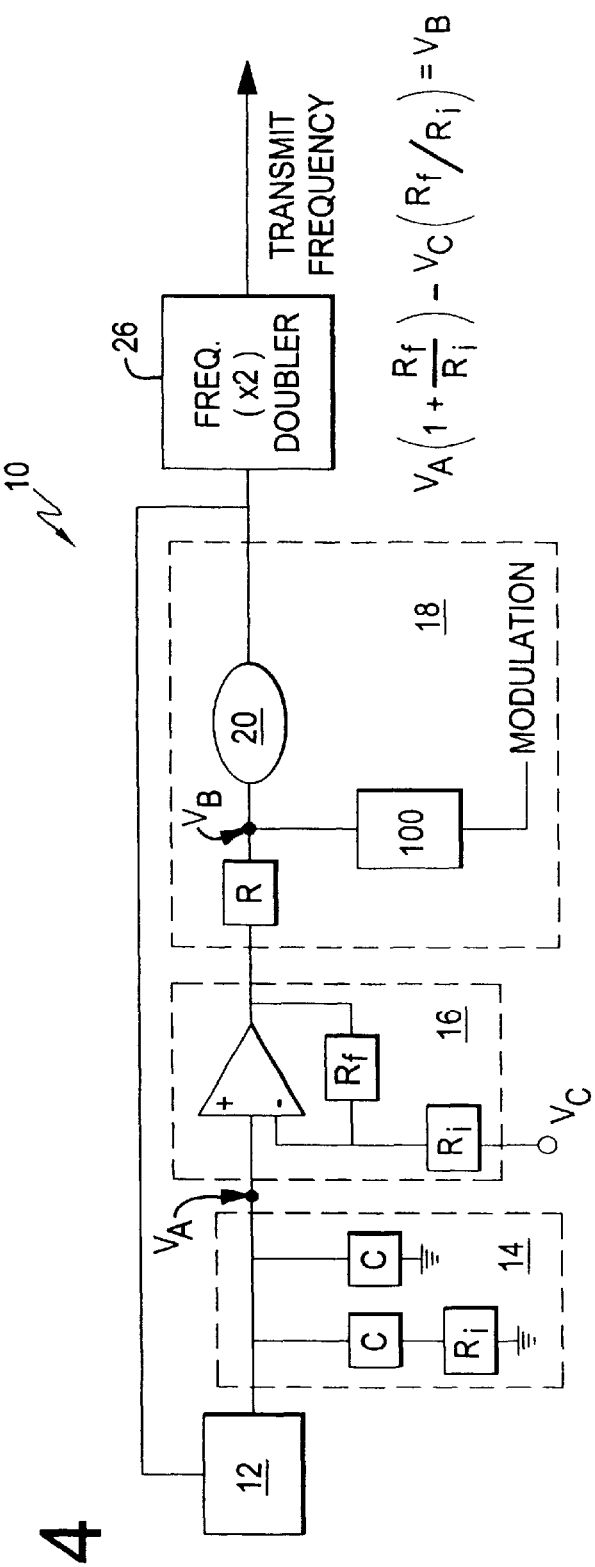
FIG. 4 is a block of the preferred embodiment of the present invention.

Referring to FIG. 4, a preferred embodiment of the present invention is depicted as a dual-mode open-loop modulator 10 for a local oscillator 24 utilizing a transmit mode and a receive mode communication frequency. The dual-mode open-loop modulator 10 comprises a synthesizer 12 for stabilizing a reference, center or carrier frequency. The synthesizer 12 is responsive to the communication frequency mode selected, i.e., transmit or receive. A loop filter 14 is operably connected to the output of the synthesizer 12. The loop filter 14 includes at least one capacitor and preferably a resistor.

An op-amp circuit 16 is operably responsive to the loop filter 14. The op-amp circuit 16 has a first input (non-inverting terminal), a second input (inverting terminal) and an output. The inverting terminal input of the op-amp is operably responsive to a loop filter voltage, $V_A$. The second input of the op-amp is operably responsive to an offset voltage $V_C$ and the output of the op-amp circuit 16. A modulator circuit 18 is utilized to impress a modulation onto the carrier frequency. The modulator circuit 18 has a voltage control oscillator 20. The input of the voltage control oscillator 20, designated $V_B$, is operably responsive to a tuning voltage, the output of the op-amp circuit 16 and a modulator 22. The output of the voltage control oscillator 20 is operably connected to the synthesizer 12 and the local oscillator 24.

The loop filter voltage, $V_A$, is maintained to a substantially constant value during either communication frequency mode wherein the substantially constant loop filter voltage $V_A$ minimizes dielectric absorption of the loop filter capacitor(s), thus reducing frequency drift of the reference frequency during open-loop modulation. In response to $V_B$, the offset voltage $V_C$ is selected to maintain the loop filter voltage $V_A$ substantially constant.

The dual-mode open-loop modulator circuit 10 is configured to maintain a constant voltage across the capacitor(s) of the loop filter 14 and can be represented by the following equation:

$$V_A(1+R_f/R_i)-V_C(R_f/R_i)=V_B$$

For purposes of exemplification, assume that $R_{f=Ri}$; and that during the receive communication mode, the voltage at the input of the voltage control oscillator 20, $V_B$, is required to be 0.8 V to tune the voltage control oscillator to a frequency of 1164.85 MHz. In the preferred embodiment of the invention, the modulator 10 incorporates a frequency doubler 26 prior to transmitting the frequency. Thus, the frequency internal to the circuit 10 is approximately half the amount of the frequency desired in the actual operation of the circuit, i.e., 2329.7 MHz. As mentioned above, the internal frequency chosen by the radio designer is based upon several factors. As such, the designer can select the internal frequency in view of these factors and then adjust the frequency accordingly, prior to its external transmission. The offset voltage, $V_C$, is externally set to 2.2 V. The synthesizer 12 will drive the loop filter voltage, $V_A$, to 1.5 V for the loop to lock up, i.e., (2)(1.5) V−2.2 V=0.8 V.

The moment the synthesizer 12 tunes the voltage control oscillator 20 to the transmit frequency of 1221 MHz, the offset voltage, $V_C$, is abruptly switched from 2.2 V to 1.2 V. This action drives the voltage at $V_B$ higher by 1 V and tunes the voltage control oscillator 20 very close to its predetermined transmit frequency, e.g., the voltage control oscillator tunes to 1221 MHz at a transmit tuning voltage of 1.8 V. The synthesizer 12 finely adjusts the voltage at $V_A$ to make the frequency exactly 1221.000 MHz. The calculations show that the voltage at $V_A$ across the capacitors, preferably C1 and C2, remains substantially constant at 1.5 V after the transition of the communication mode from receive to transmit. The frequency is then adjusted, i.e., doubled, before being transmitted external to the open-loop modulator 10 at 2329.7 MHz.

Maintaining the voltage across the loop filter capacitor(s), i.e., $V_A$, irrespective of the communication mode being utilized will reduce the dielectric absorption memory effect in the loop filter capacitor(s). The voltage across the loop filter capacitor(s) remains substantially the same during both the transmit and receive periods.

Preferably, the voltage across the loop filter capacitors is maintained by using an offset voltage, $V_C$. The offset voltage $V_C$ is selected in response to the tuning voltage fed into the voltage control oscillator 20 during re-tuning from receive mode to transmit mode. The voltage difference between the offset voltage $V_C$ used for each communication mode is substantially equal to the voltage difference between the receive tuning voltage and the transmit tuning voltage, i.e., substantially equivalent to a frequency offset equal to the first intermediate frequency.

There may be slight differences between the receive and transmit tuning voltages due to the offset step not exactly driving the voltage control oscillator to the desired 56.15 MHz frequency jump. However, this differential will be on the order of 0.1 V, therefore, the dielectric absorption memory effect will be significantly diminished.

It is to be understood by one of ordinary skill in the art that the present invention can be easily implemented for use with many frequencies and that the components, i.e., resistors, capacitors, operational amplifiers (op-amps) and their respective values, can be selected theoretically and/or empirically to attain the functionality described.

While the specific embodiment has been illustrated and described, numerous modifications come to mind without significantly departing from the spirit of the invention, and the scope of protection is only limited by the scope of the accompanying claims.

I claim:

1. A method of providing an open-loop modulated carrier frequency to a local oscillator utilizing a receive mode and a transmit mode for signal communication, the method comprising the steps of:

provide a phase lock loop, the phase lock loop comprising a synthesizer, a loop filter having a voltage across a capacitor, an op-amp circuit, a voltage control oscillator having an input voltage, and a modulator being operably coupled in a continuous loop, the phase lock loop being capable of stabilizing a center frequency for cooperating with a transmit frequency, a receive frequency and an intermediate frequency;

tuning the voltage control oscillator to the receive frequency by applying a receive tune voltage to the voltage control oscillator;

tuning the voltage control oscillator to the transmit frequency by applying a transmit tune voltage to the voltage control oscillator;

disconnecting the continuous phase lock loop in response to the tuning of the voltage control oscillator to the transmit frequency;

applying a modulation onto the center frequency; and, maintaining the voltage across the capacitor of the loop filter substantially constant irrespective of the receive mode and the transmit mode by applying a predetermined offset voltage to the op-amp circuit in response to the signal communication mode, wherein the offset voltage applied during the transmit mode is substantially equal to the difference in tuning voltages applied to the voltage control oscillator for the transmit mode and the receive mode, respectively, and further wherein the substantially constant voltage across the capacitor reduces dielectric absorption of the capacitor, thus reducing frequency drift to the transmit frequency during open-loop modulation.

2. The method of claim 1 wherein the voltage difference is correlated to a frequency offset substantially equal to a first intermediate frequency of the phase lock loop.

3. The method of claim 1 wherein the transmit frequency ranges from 1.20–1.24 GHz.

4. The method of claim 1 wherein the transmit frequency is substantially 1.221 GHz.

5. The method of claim 1 the intermediate frequency is substantially 56.15 MHz.

6. The method of claim 1 wherein the disconnecting of the continuous phase lock loop comprises the step of operating the synthesizer in a high impedance mode.

7. A method of providing an open-loop modulated carrier frequency to a local oscillator utilizing a receive mode and a transmit mode for frequency modulated signal communication, the method comprising the steps of:

providing a phase lock loop, the phase lock loop comprising:
a synthesizer for stabilizing a reference frequency, the synthesizer having an input and an output;
a loop filter having a voltage across a capacitor and being operably coupled to the output of the synthesizer;
an op-amp circuit having a first input, a second input and an output, the first input being operably coupled to the synthesizer and the loop filter, the second input being operably responsive to an offset voltage and the output of the op-amp circuit; and,
a voltage control oscillator having an input voltage and being operably responsive to the op-amp circuit and a modulator, wherein the voltage of the loop filter being substantially equal to one-half the sum of the offset voltage and the input voltage of the voltage control oscillator;

tuning the voltage control oscillator to a predetermined transmit frequency;

disconnecting the continuous phase lock loop in response to the tuning of the voltage control oscillator to the transmit frequency;

applying a frequency modulation to the voltage control oscillator; and, adjusting the offset voltage in response to the transmit frequency wherein the offset voltage applied during the transmit mode is substantially equal to the difference in tuning voltages respectively applied to the voltage control oscillator of the transmit mode and the receive mode, the voltage difference being correlated to a frequency offset substantially equal to an intermediate frequency of the phase lock loop, and further wherein the loop filter voltage is maintained substantially constant, the constant loop filter voltage reduces dielectric absorption of the capacitor, thus reducing frequency drift of the transmit frequency during open-loop modulation.

8. The method of claim 7 wherein the disconnecting of the continuous phase lock loop comprises operating the synthesizer in a high impedance mode.

9. The method of claim 7 further comprising:
tuning the voltage control oscillator to a predetermined receive frequency;
connecting the continuous phase lock loop in response to the tuning of the voltage control oscillator to the receive frequency;
discontinuing the application of the frequency modulation to the voltage control oscillator;
adjusting the offset voltage in response to the receive frequency wherein the loop filter voltage is maintained substantially constant, the substantially constant loop filter voltage reduces dielectric absorption of the capacitor, thus reducing frequency drift of the transmit frequency during open-loop modulation.

10. A dual-mode open-loop modulator for a local oscillator utilizing a transmit mode and a receive mode communication frequency, the dual-mode open-loop modulator comprising:

a synthesizer for stabilizing a reference frequency, the synthesizer being operably responsive to the communication frequency mode;

a loop filter having a voltage across a capacitor, the loop filter being operably connected to the output of the synthesizer;

an op-amp circuit having a first input, a second input and an output, the first input of the op-amp being operably responsive to the loop filter voltage, and the second input of the op-amp being operably responsive to an offset voltage and the output of the op-amp circuit;

a modulator circuit having a voltage control oscillator including an input and an output, the input of the voltage control oscillator being operably responsive to a tuning voltage, the output of the op-amp circuit and a modulator, the output of the voltage control oscillator being operably connected to the synthesizer; and, an offset voltage being responsive to the communication mode and being applied to the second input of the op-amp circuit, the offset voltage for maintaining the loop filter voltage substantially constant during either communication frequency mode wherein the offset voltage applied during the transmit mode is substantially equal to the difference in tuning voltages respectively applied to the voltage control oscillator during the transmit mode and the receive mode, and further wherein the substantially constant loop filter voltage minimizes dielectric absorption of the loop filter capacitor, thus reducing frequency drift of the reference frequency during open-loop modulation.

11. The dual-mode open-loop modulator of claim 10 wherein the offset voltage is correlated to a frequency offset substantially equal to a first intermediate frequency of the phase lock loop.

12. The dual-mode open-loop modulator of claim 11 wherein the reference frequency is an intermediate frequency substantially equal to 56.15 MHz.

13. The dual-mode open-loop modulator of claim 11 wherein the reference frequency is a transmit frequency ranging from 1.20–1.24 GHz.

14. The dual-mode open-loop modulator of claim 11 wherein the transmit frequency is substantially 1.221 GHz.

15. A dual-mode open-loop modulator for a local oscillator utilizing a transmit and receive communication frequency, the dual-mode modulator comprising:

a synthesizer for stabilizing a reference frequency;

a loop filter operably connected to the output of the synthesizer;

an op-amp circuit having a first input, a second input and an output, the first input of the op-amp having a voltage, $V_A$, and being operably responsive to the loop filter and the synthesizer, the second input of the op-amp circuit being operably responsive to an offset voltage, $V_C$, and the output of the op-amp circuit; the offset voltage being responsive to the communication frequency; and, a modulating circuit having a voltage control oscillator being operably responsive to a tuning voltage for selecting the communication frequency, the voltage control oscillator including an input and an output, the input of the voltage control oscillator having a voltage, $V_B$, the output of the voltage control oscillator being operably connected to the synthesizer wherein the dual-mode modulator is represented by an equation $V_A(1+R_f/R_i)-V_C(R_f/R_i)=V_B$.

16. The dual-mode open-loop modulator of claim 15 wherein the offset voltage applied in response to the transmit mode is substantially equal to the voltage difference between the receive tuning voltage and the transmit tuning voltage.

17. The dual-mode open-loop modulator of claim 15 wherein the offset voltage is correlated to a frequency offset substantially equal to a first intermediate frequency of the dual-mode modulator.

* * * * *